United States Patent
Mongold et al.

(10) Patent No.: US 11,139,620 B2
(45) Date of Patent: *Oct. 5, 2021

(54) OVERMOLDED LEAD FRAME PROVIDING CONTACT SUPPORT AND IMPEDANCE MATCHING PROPERTIES

(71) Applicant: Samtec, Inc., New Albany, IN (US)

(72) Inventors: John A. Mongold, New Albany, IN (US); Jonathan E. Buck, New Albany, IN (US)

(73) Assignee: SAMTEC, INC., New Albany (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/789,520

(22) Filed: Feb. 13, 2020

(65) Prior Publication Data
US 2020/0185862 A1 Jun. 11, 2020

Related U.S. Application Data

(63) Continuation of application No. 16/592,812, filed on Oct. 4, 2019, which is a continuation of application
(Continued)

(51) Int. Cl.
*H01R 13/6477* (2011.01)
*H01R 13/514* (2006.01)
(Continued)

(52) U.S. Cl.
CPC ....... *H01R 13/6477* (2013.01); *H01R 12/724* (2013.01); *H01R 13/41* (2013.01);
(Continued)

(58) Field of Classification Search
CPC .............. H01R 23/6873; H01R 13/514; H01R 13/6477; H01R 13/646; H01R 13/6473; H03H 7/38
See application file for complete search history.

(56) References Cited

U.S. PATENT DOCUMENTS 6,652,318 B1 * 11/2003 Winings ............. H01R 13/6471
439/607.07
8,961,228 B2 * 2/2015 Jeon ....................... H01R 12/00
439/607.07
(Continued)

FOREIGN PATENT DOCUMENTS

CN 1056382 A 11/1991
CN 101006616 A 7/2007
(Continued)

OTHER PUBLICATIONS

Mongold et al., "Overmolded Lead Frame Providing Contact Support and Impedance Matching Properties", U.S. Appl. No. 16/592,812, filed Oct. 4, 2019.
(Continued)

*Primary Examiner* — Vanessa Girardi
(74) *Attorney, Agent, or Firm* — Keating & Bennett, LLP

(57) ABSTRACT

An electrical connector includes first and second adjacent electrical contacts that each define respective first and second mating ends, the first mating end of a first one of the first and second adjacent electrical contacts defines a first contact surface, the second mating end of a second one of the first and second adjacent electrical contacts defines a second contact surface electrically isolated from the first contact surface; and a dielectric material positioned between the first and second adjacent electrical contacts. When a mating connector applies a force to the first contact surface and the second contact surface, the first and second mating ends and the dielectric material all move in a first direction.

15 Claims, 16 Drawing Sheets

Related U.S. Application Data

No. 15/566,504, filed as application No. PCT/US2017/037676 on Jun. 15, 2017, now Pat. No. 10,439,330.

(60) Provisional application No. 62/518,867, filed on Jun. 13, 2017, provisional application No. 62/350,285, filed on Jun. 15, 2016.

(51) Int. Cl.
| | |
|---|---|
| H01R 13/646 | (2011.01) |
| H03H 7/38 | (2006.01) |
| H01R 12/72 | (2011.01) |
| H01R 13/41 | (2006.01) |
| H01R 13/631 | (2006.01) |

(52) U.S. Cl.
CPC ....... *H01R 13/514* (2013.01); *H01R 13/6315* (2013.01); *H01R 13/646* (2013.01); *H03H 7/38* (2013.01)

(56) References Cited

U.S. PATENT DOCUMENTS

| | | | |
|---|---|---|---|
| 10,431,936 | B2 | 10/2019 | Horning et al. |
| 10,439,330 | B2 * | 10/2019 | Mongold ............ H01R 12/724 |
| 2003/0109182 | A1 | 6/2003 | Miyazawa et al. |
| 2004/0005816 | A1 | 1/2004 | Sato et al. |
| 2005/0020109 | A1 | 1/2005 | Raistrick et al. |
| 2009/0017693 | A1 | 1/2009 | Nagata et al. |
| 2010/0075536 | A1 | 3/2010 | Kubo |
| 2013/0196550 | A1 | 8/2013 | Casher et al. |
| 2013/0224999 | A1 | 8/2013 | Jeon |

FOREIGN PATENT DOCUMENTS

| | | |
|---|---|---|
| CN | 101611521 A | 12/2009 |
| CN | 101711443 A | 5/2010 |
| CN | 102195173 A | 9/2011 |
| CN | 102655288 A | 9/2012 |
| CN | 103311748 A | 9/2013 |
| CN | 205016739 U | 2/2016 |
| EP | 0 455 367 A2 | 11/1991 |
| GN | 101345373 A | 1/2009 |
| JP | 2004-103527 A | 4/2004 |

OTHER PUBLICATIONS

TE connectivity, "Strada Whisper R Backplane Connectors", www.te.com/products/stradawhisper, Aug. 2019, pp. 1&2.

Te connectivity, "Strada Whisper Backplane Connectors", www.te.com/products/stradawhisper, May 2018, pp. 1-4.

Official Communication issued in corresponding Chinese Patent Application No. 202010116028.7, dated Nov. 20, 2020.

Official Communication issued in corresponding Chinese Patent Application No. 202010115766.X, dated Nov. 23, 2020.

Official Communication issued in corresponding Taiwanese Patent Application No. 109104997, dated Dec. 10, 2020.

Official Communication issued in corresponding Chinese Patent Application No. 202010115767.4, dated Feb. 26, 2021.

* cited by examiner

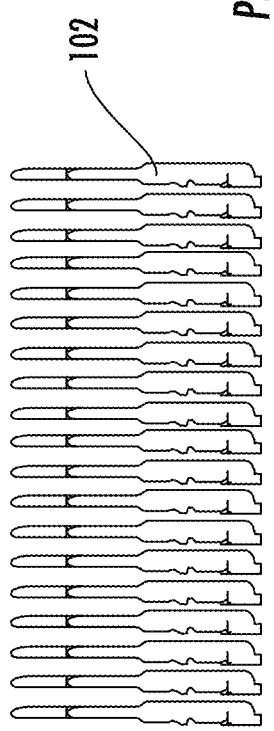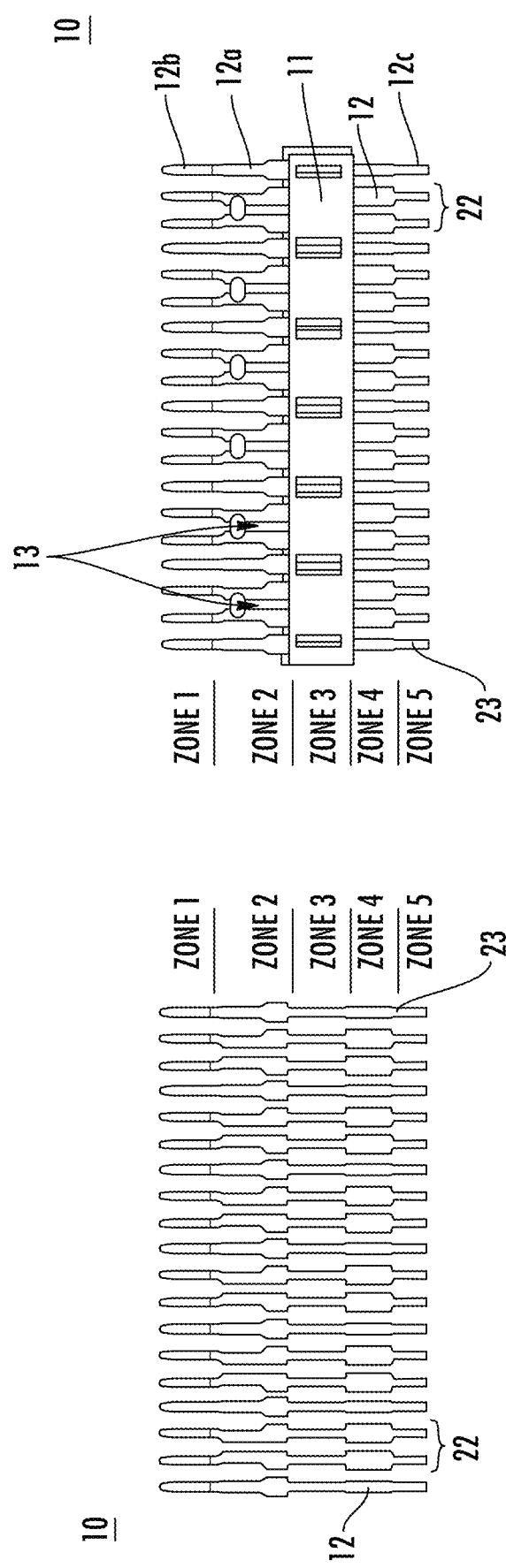

OVERMOLDED LEAD FRAME PROVIDING CONTACT SUPPORT AND IMPEDANCE MATCHING PROPERTIES

BACKGROUND OF THE INVENTION

1. Field of the Invention

The present invention relates to connectors. More specifically, the present invention relates to a connector with an overmolded lead frame that includes a web between adjacent contacts.

2. Description of the Related Art

A known connector 100 is shown in FIG. 1. The connector 100 includes a housing 101 that surrounds contacts 102 that transmit electrical signals. A portion of the housing 101 in FIG. 1 is cut away to show the bottom row 115 of contacts 102. Although not shown in FIG. 1, the connector 100 is typically mounted to a printed circuit board (PCB). The PCB includes traces that transmit electrical signals. The housing 101 includes an opening 103 into which, for example, an edgecard can be inserted. The edgecard includes pads that engage with the beams 102a of the contacts 102. The beams 102a deflect as the edgecard is inserted into the housing 101, creating a mechanical and electrical connection between the contacts 102 and pads. An edgecard to be used with the connector shown in FIG. 1 will typically include pads on the top and bottom surfaces that engage with the top row 110 of contacts 102 (not shown in FIG. 1) and with the bottom row 115 of contacts 102. The contacts 102 in the connector 100 provide an electrical path between the pads of the edgecard and the traces in the PCB.

FIG. 7 shows the contacts 102 from the bottom row 115 of the connector 100 shown in FIG. 1. The contacts 102 in FIG. 7 are in an open-pin-field arrangement in that the contacts 102 can be assigned different functions, including, for example, as signal contacts, i.e., a single contact for single-ended signals or a pair of contacts for differential signals, or as ground contacts, i.e., contacts connected to ground. In high-speed applications, adjacent contacts 102 can be paired together to transmit a differential signal. The adjacent differential pairs of contacts 106 can be separated by a ground contact 107. The shape of the contacts 102 in FIG. 7 is determined by mechanical considerations and not by signal integrity considerations.

As electrical signals are transmitted between the pads of the edgecard and the traces in the PCB, the electrical signals may experience degradation in signal integrity due to the changing transmission line impedance along the signal path. As shown in FIG. 2, the connector 100 includes an insulating, dielectric plastic wall 104 between adjacent contacts 102 to avoid shorting of adjacent contacts 102. The dielectric properties of the plastic may be chosen to reduce the potential impedance mismatch along the length of the contact beam 102a.

As shown in FIGS. 3 and 4, additional space between the walls 104 and the contacts 102 is needed for positional tolerances, i.e. so the contact 102 does not bind against the wall 104 when it deflects to mate to an edge card. This additional space results in a wider air gap 105 between the contact beams 102a and the walls 104. The wider air gap 105 between the contacts 102 and the walls 104 limits the ability to impedance match the transmission line.

As shown in FIG. 2, there is no structure that deflects with the contacts 102 as the contact beams 102a are deflected. The tips 102b of adjacent contact beams 102a can spread wider apart or come closer together during deflection, which can change the impedance of the transmission line formed by the contact beams 102a.

High-speed connectors often include ground planes to separate the signal paths and to electrically connect the individual ground contacts 107 together. FIG. 5 shows the high-speed connector 100 in which adjacent signal contacts 102 are surrounded by ground contacts 107. The adjacent signal contacts 102 can be grouped in a differential pair 106 that transmits differential signals.

FIG. 6 is a sectional view of the connector 100 that shows the top 110 and bottom 115 rows of contacts 102. The contacts 102 of both the top 110 and bottom 115 rows include a 90° bend and a portion that extends from the 90° bend downward towards a PCB (not shown). The contacts 102 of the top 110 and bottom 115 rows can be surface mounted to the PCB, which creates mechanical and electrical connections to pads on the PCB. The pads of the PCB are connected to the traces in the PCB. The contacts 102 of the top row 110 of contacts extend out and over the contacts 102 of the bottom row 115 of contacts.

SUMMARY OF THE INVENTION

To overcome the problems described above, preferred embodiments of the present invention provide a connector that can be used in high-speed applications, that has improved impedance matching, and that includes a material between the contacts that deflects with the contacts.

According a preferred embodiment of the present invention, an electrical connector includes first and second adjacent electrical contacts that each define respective first and second mating ends, the first mating end of a first one of the first and second adjacent electrical contacts defines a first contact surface, the second mating end of a second one of the first and second adjacent electrical contacts defines a second contact surface electrically isolated from the first contact surface; and a dielectric material positioned between the first and second adjacent electrical contacts. When a mating connector applies a force to the first contact surface and the second contact surface, the first and second mating ends and the dielectric material all move in a first direction.

The electrical connector further preferably includes a third electrical contact positioned immediately adjacent to and edge-to-edge with the second one of the first and second electrical contacts. The electrical connector is preferably devoid of dielectric material between the third electrical contact and the second one of the first and second adjacent electrical contacts.

Preferably, the first and second adjacent electrical contacts are each cantilevered with respect to a dielectric wafer housing, and the dielectric material is a web positioned between the first and second adjacent electrical contacts. The web is preferably cantilevered with respect to a pivot point adjacent to the dielectric wafer housing such that the web also moves in the first direction when a mating connector applies a force to the first contact surface and the second contact surface.

The electrical connector further preferably including a first differential signal pair and a second differential signal pair carried by a dielectric housing and a ground shield positioned adjacent to the dielectric housing. Preferably, the dielectric housing defines a first air gap between the first and second adjacent signal contacts of the first differential signal pair, a second air gap between third and fourth adjacent signal contacts of the second differential signal pair, and a third air gap between the second signal contact and the third signal contact that exposes the ground shield to air between the second signal contact and the third signal contact.

The electrical connector preferably has a differential insertion loss of less than −1 dB through approximately 1 GHz at frequencies between approximately 1 GHz and approximately 25 GHz. The electrical connector preferably has a differential insertion loss of less than −1 dB at frequencies between approximately 1 GHz and approximately 33 GHz. A frequency domain near end crosstalk is preferably below −50 dB at frequencies between approximately 1 GHz and approximately 34 GHz. A frequency domain near end crosstalk is preferably below −60 dB at frequencies between approximately 1 GHz and approximately 31 GHz. A frequency domain far end crosstalk is preferably below −50 dB at frequencies between approximately 1 GHz and approximately 34 GHz. A frequency domain far end crosstalk is preferably below −60 dB at frequencies between approximately 1 GHz and approximately 25 GHz.

The electrical connector further preferably includes an electrical connector housing. The electrical connector housing preferably does not define front ribs between the first and second mating ends of first and second adjacent signal conductors.

The dielectric material preferably is cantilevered.

According to a preferred embodiment of the present invention, an electrical connector includes an electrical connector housing that carries first and second adjacent electrical contacts. The first and second adjacent electrical contacts each define respective first and second mating ends, and the electrical connector housing does not define front ribs between the first and second mating ends of the first and second adjacent signal conductors.

According to a preferred embodiment of the present invention, an electrical connector includes a dielectric housing; a first electrical contact carried by the electrically dielectric housing, the first electrical contact defines a first contact surface; a second electrical contact carried by the housing and positioned adjacent to the first electrical contact to define a differential signal pair with the first electrical contact, the second electrical contact defining a second contact surface electrically isolated from the first contact surface; and a dielectric material that extends between the first electrical contact and the second electrical contact, the dielectric material extends continuously from a point adjacent to the dielectric housing and terminates prior to the first contact surface.

The dielectric material preferably is a web integrally formed with the dielectric housing. Preferably, when a mating connector applies a force to the first contact surface and the second contact surface, the first and second mating ends and the cantilevered dielectric material all move in a first direction. The dielectric material preferably is cantilevered. The dielectric material preferably is cantilevered with respect to a pivot point adjacent to a dielectric wafer housing.

Preferably, the first and second adjacent electrical contacts each define two opposed edges, the first and second adjacent electrical contacts are positioned edge-to-edge, and the first and second adjacent electrical contacts are physically connected to one another adjacent to the first and second mating ends by the dielectric material.

The electrical connector further preferably includes a dielectric button positioned only between the first and second adjacent electrical contacts.

According to a preferred embodiment of the present invention, an electrical connector includes a first differential signal pair and a second differential signal pair carried by a dielectric housing and a ground shield positioned adjacent to the dielectric housing. The dielectric housing defines a first air gap between first and second adjacent signal contacts of the first differential signal pair, a second air gap between third and fourth adjacent signal contacts of the second differential signal pair, and a third air gap between the second signal contact and the third signal contact that exposes the ground shield to air between the second signal contact and the third signal contact.

The above and other features, elements, characteristics, steps, and advantages of the present invention will become more apparent from the following detailed description of preferred embodiments of the present invention with reference to the attached drawings.

BRIEF DESCRIPTION OF THE DRAWINGS

FIG. 7 is a top view of the contacts used in the connector shown in FIG. 1.

FIGS. 8 and 9 are top views of the contacts according to a preferred embodiment of the present invention.

DETAILED DESCRIPTION OF PREFERRED EMBODIMENTS

Figure 3:
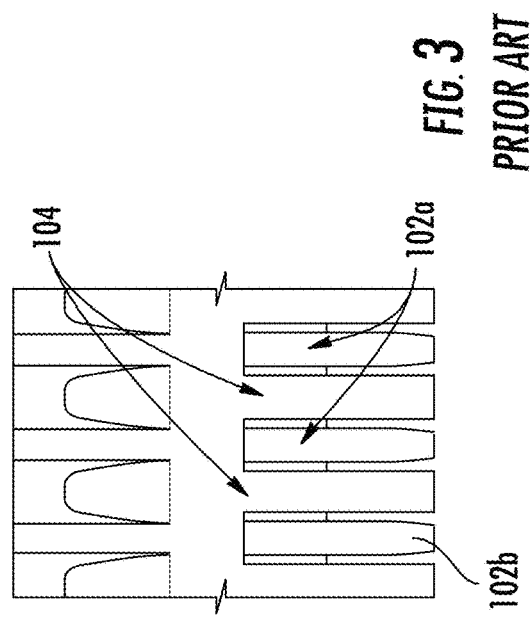
FIGS. 2-4 are close-up views of the contacts of the connector shown in FIG. 1.
Figure 4:
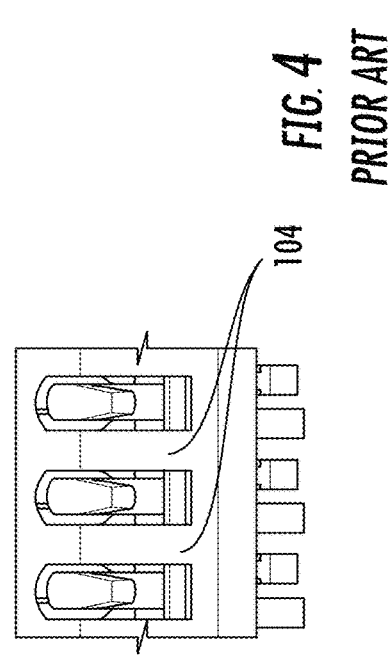
Figure 1:
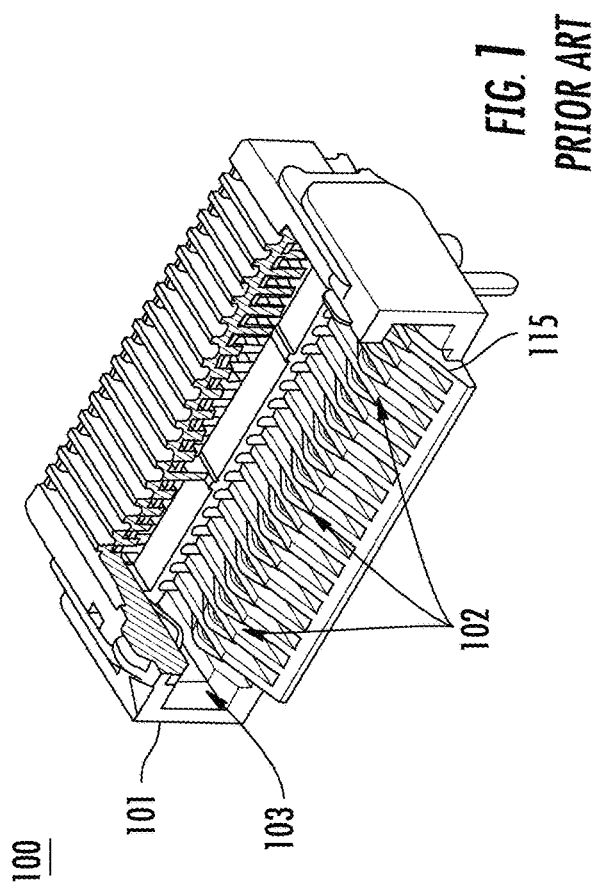
FIG. 1 is a cut-out view of a conventional connector.
Figure 2:
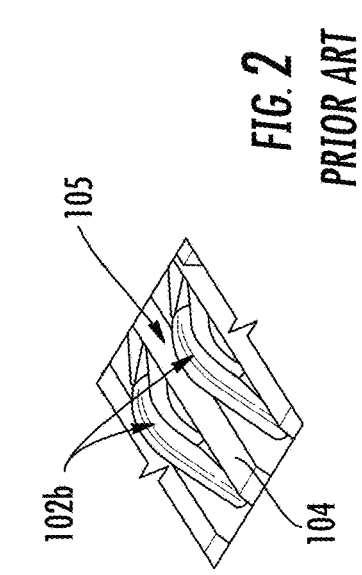
Figure 5:
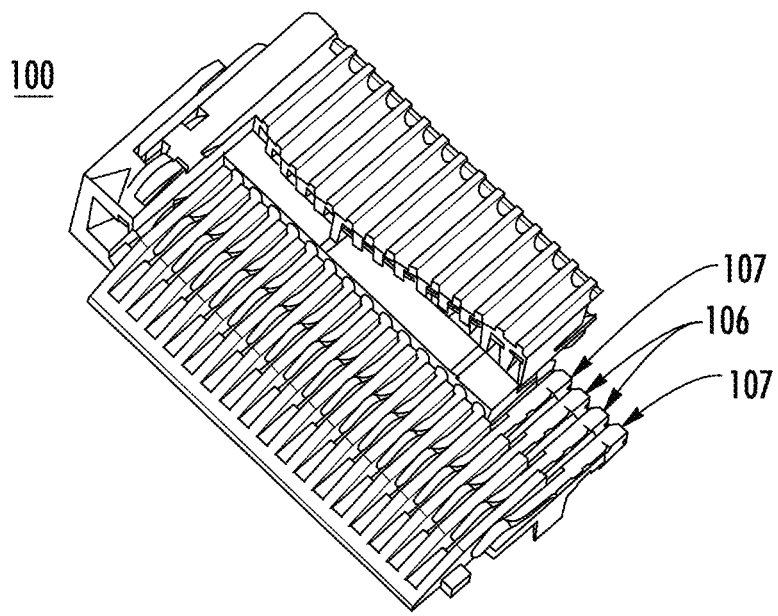
FIG. 5 is a cut-out view of the connector shown in FIG. 1.
Figure 6:
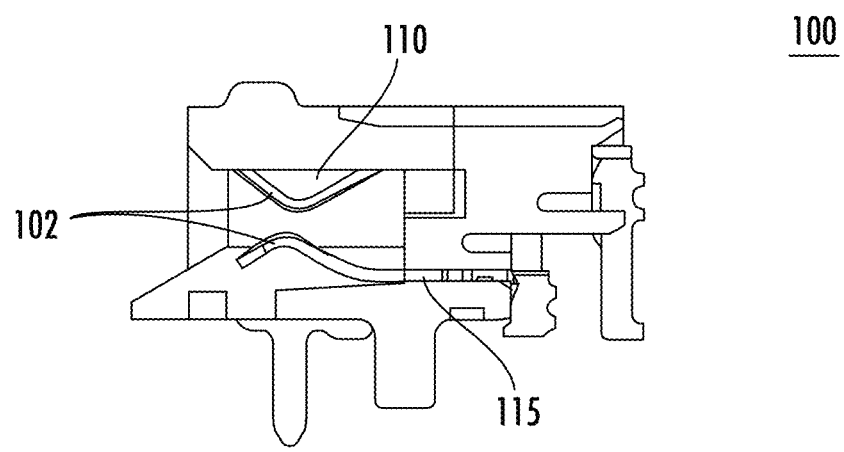
FIG. 6 is a cross-section view of the connector shown in FIG. 1.

FIGS. 8-23 show lead frames according to preferred embodiments of the present invention. The lead frames shown in FIGS. 8-18 can be used as a bottom row of contacts, and the lead frames shown in FIG. 19-23 can be used as a top row of contacts. The lead frames can be used in any suitable connector, including a connector similar to the one shown in FIGS. 1 and 5. The lead frames can be used in connectors with housings that do not include walls or ribs between adjacent contacts. The lead frames can also be used in the connector shown in FIGS. 24 and 25 that have ribs between the ground contacts and the pairs of differential signal contacts, but not between the pairs of differential signal contacts. It is possible to use the lead frames shown in FIGS. 8-23 in a connector with only a single row of contacts. It is also possible to use more than one lead frame per row of contacts. It is possible to use the techniques discussed below to tune the impedance of the differential pairs to have any suitable impedance, e.g. 85±10 Ω, 92±10Ω, or 100±10Ω.

FIG. 8 shows the lead frame 10 for a bottom row of contacts 12. FIG. 9 shows the same lead frame 10 as FIG. 8 and includes the wafer 11 connecting the contacts 12 and the web 13 between the contacts 22 of a differential pair. Reference number 12 generally refers to all contacts, which include ground contacts 23 and contacts 22 in a differential pair.

Figure 10:
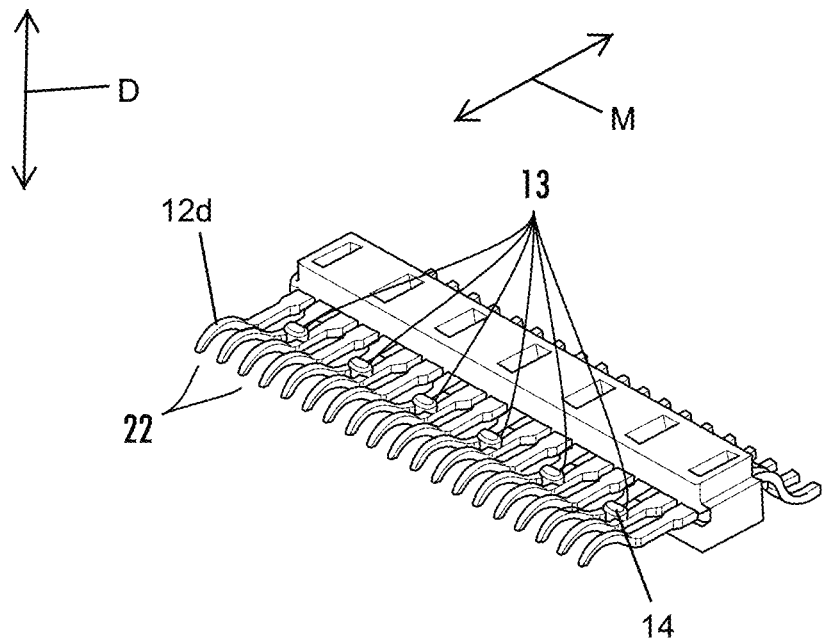
FIG. 10 is a perspective view of a lead frame for a bottom row of contacts according to a preferred embodiment of the present invention.

FIGS. 9 and 10 show that a web 13, made from electrically dielectric plastic, plastic containing magnetic absorbing material, i.e., magnetic lossy material, such as ferrite or carbon material at a percentage low enough to prevent electrical shorting of a differential signal pair, or other similar material, fills at least a portion of the gap between the adjacent contact beams 12a of the differential signal contacts 22. The wafer 11 is also be made from materials similar to or the same as the web. The adjacent contacts 12 defining the differential signal contacts 22 are physically connected by the web 13, and the differential signal contacts 22 are not physically connected by the web 13 to the contacts 12 adjacent to but not included in the differential signal contacts 22. The web 13 is preferably made of a dielectric material other than air. For example, the web 13 can be made of a plastic formed by molding, but other suitable materials and methods could also be used to form the web 13. The web 13 is movable and flexes in first directions D that are both transverse to the mating and unmating directions M.

The lead frames 10 can be formed by stamping the contacts 12 to have a desired shape as discussed above and then forming the wafer 11 by injection molding. Instead of injection molding, other suitable processes, including, for example, dam-and-fill encapsulation, can be used to form the lead frames 10. In dam-and-fill encapsulation, a dam material is used to create a dam, and the dam is then filled with an encapsulant that is typically infra-red (IR) or thermally cured or hardened. Because the web 13 can replace the walls between adjacent contacts 22, positional tolerances between the contacts 22 are relaxed, allowing the adjacent contacts 22 to be moved closer together. Because the web 13 between adjacent contacts 22 can be made of a material other than air with a dielectric constant of about 3.5, which is higher than the dielectric constant of air of 1, it is possible to better impedance match the contact region with the adjacent transmission lines, such as those on the PCB. Also, because the adjacent contacts 22 are secured in the dielectric web 13, the positions between the adjacent contacts 22 remain fixed as the adjacent contacts 22 flex while being mated. Better control of the geometry between all of the contacts 12 reduces the variation in impedance between the various differential signal pairs in the connector. The contacts 22 can define contact tips 12b. A first contact tip 12b may further define a first contact surface 12d, and the second contact tip 12b may further define a second contact surface 12d. The first contact tip 12b and the second contact tip 12b may be immediately adjacent to one another, and the first contact surface 12d and the second contact surface 12d may be immediately adjacent to one another. The first contact surface 12d and the second contact surface 12d may physically, electrically, or both physically and electrically contact a respective mating PCB pad or a respective mating contact of a mating connector. The contacts 22 may also define two opposed edges and two opposed broadsides, and two adjacent contacts 22 may be positioned edge-to-edge or broadside-to-broadside. The web 13 may be positioned between the edges or the broadsides of two adjacent contacts 22.

Figure 11:
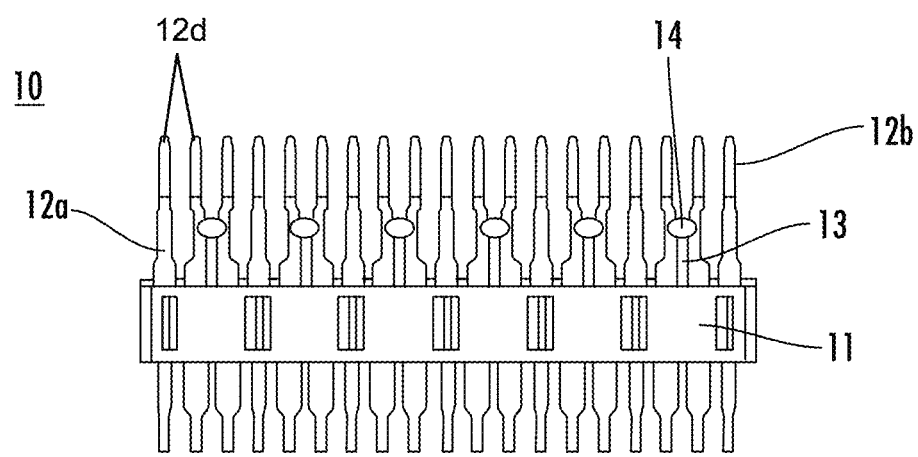
FIG. 11 is a top view of the lead frame shown in FIG. 10.

As shown in FIG. 11, the tips 12b of the contacts 12 can be jogged to a larger or smaller spacing. The spacing of the tips 12b of the contacts 12 should match the spacing between the pads on the edgecard. Larger spacing between the tips 12b of the contacts 12 corresponds to larger spacing between the pads on the edgecard. The tips 12b of the contacts 12 can be jogged such that the spacing between the tips 12b or contact surfaces 12d of adjacent contacts 12 is the same for each adjacent pair of contacts 22, which allows for the same spacing between adjacent pads on the edgecard, which can make the edgecard easier to manufacture. The jogging of the tips 12b of the contacts 12 can result in the tips 12b having a higher impedance.

As shown in FIGS. 10, 11, 12, and 13, the web 13 can include a button 14 near the tips 12b of the contacts 12 or between the wafer 11 and the contact tips 12b or contact surfaces 12d (as shown in FIG. 11). The button 14 anchors the web 13 to the contact beams 12a, allowing the web 13 to move with the contact beams 12a as the contact beams 12a deflect. The web 13 keeps the adjacent contacts 22 spaced apart at a constant distance from each other, even when the contact beams 12a are deflected. The constant distance between adjacent contacts 22 improves the impedance matching. The web 13, button 14, or both can be positioned only between the first and second electrical contacts 22, and not between a third electrical contact immediately adjacent to the first or second electrical contacts 22 and either of the first and second electrical contacts 22. The electrical connector may be devoid of movable, dielectric material, such as web 13 or button 14, between the third electrical contact and either of the first and second adjacent electrical contacts 22. The web 13 or button 14 can be attached to the wafer 11 or not be attached to the wafer 11.

In one preferred embodiment, an electrical connector is provided. The electrical connector may include first and second adjacent signal contacts that define a first differential signal pair and a third electrical contact positioned immediately adjacent to, and possibly edge-to-edge with, the second one of the first and second electrical contacts. The two first and second adjacent signal contacts are attached to one another such that when contact tails are fixed by a wafer or another dielectric housing and a first direction D force is applied to one of the two first and second adjacent signal contacts, a first mating end of the first adjacent signal contact and a second mating end of the second adjacent signal contact also move in one of first directions D even though the first and second adjacent signal contacts are not physically connected by electrically conductive material and are electrically isolated from one another along entire physical lengths of the first and second adjacent signal contacts. The first and second mating ends of the first and second adjacent signal conductors can be cantilevered with respect to a wafer or an electrically dielectric wafer housing that may be fixed and may carry the first and second adjacent signal conductors having respective conductor portions fixed with respect to the wafer or the wafer housing. The contact surfaces 12*d* or adjacent contact surfaces 12*d* of contact tips 12*b* may be oriented to be coincident with a common plane and not perpendicular to a common plane. The contact surfaces 12*d* or adjacent contact surfaces 12*d* of the contact tips 12*b* may not face or oppose one another. Adjacent contact surfaces 12*d* of two adjacent contacts 22 of a differential signal pair may not lie in parallel planes. Movement of the first or second adjacent signal contacts occurs even if a force is only directly applied to the contact tip 12*b* or the contact surface 12*d* of the first adjacent signal contact or even if a force is only directly applied to the contact tip 12*b* or the contact surface 12*d* of the immediately adjacent second adjacent signal contact. Stated another way, the first and second adjacent signal conductors are not mechanically independent of each other even though the first and second adjacent signal conductors are electrically isolated from one another. Movement of the first and second mating ends, the first mating end, or the second mating end can be in a direction transverse to a mating direction of the electrical connector with a mating electrical connector, such as a mating PCB, mating card edge, or mating electrical contact. The first and second adjacent signal conductors can be attached to one another by a web that cantilevers from a pivot point positioned adjacent to or integrally formed with the wafer or other electrically dielectric wafer housing, wherein the wafer or other electrically dielectric wafer housing and the web may be made from an dielectric material or other magnetic lossy material described above.

In other preferred embodiments, the first and second adjacent signal conductors can be attached to each other by a combination of the web and the button, by a movable, flexible, or cantilevered dielectric material, commoning band, bar, or member, or any other type of electrically non-conductive mechanical attachment mechanism that causes the first and second mating ends or contact surfaces 12*d* of the first and second adjacent signal conductors and the movable, flexible, or cantilevered dielectric material to all move in same direction at the same time. The first and second mating ends of the first and second adjacent signal conductors can functionally act as a single mating end. The first and second adjacent signal conductors and the web can all move in the same direction at the same time, to keep the impedance of the differential signal pair within $1\Omega$-$10\Omega$ during mating and unmating of a mating connector such as a mating PCB, mating card edge, or mating electrical contact. The first and second mating ends have at least two independent degrees of freedom of motion. From the commoning member forward, the first and second mating ends can move independently of each other in opposite directions assuming equal but opposite forces are applied to the two adjacent first and second mating ends. If a force is applied to just one mating end, that mating end will deflect more than the adjacent mating end, but both the first and second mating ends will both move in the same direction as the force (measured in Newtons, for example) increases.

Figure 12:
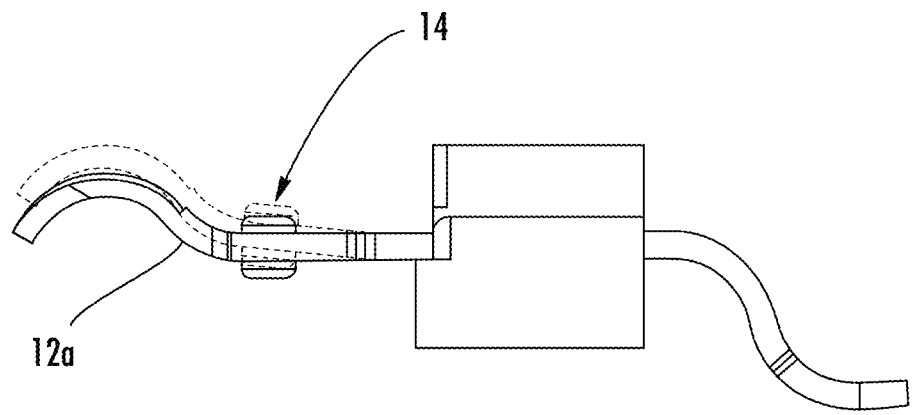
FIG. 12 is a side view of the lead frame shown in FIG. 10 showing deflection of the contacts.
Figure 13:
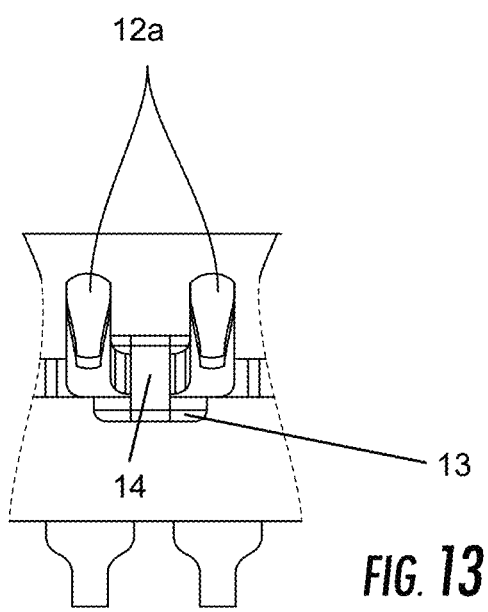
FIG. 13 is a front, partial view of the lead frame shown in FIG. 10.

As shown in FIGS. 12 and 13, the web 13 can include a button 14 on an active portion of the contact beam 12*a*, i.e., a portion of the contact 12 that moves when mated with an edgecard. The button 14 anchors the web 13 to the contact beams 12*a*, allowing the web 13 to move with the contact beams 12*a* as the contact beams 12*a* deflect. The web 13 keeps the adjacent contacts 22 spaced apart at a constant distance from each other, even when the contact beams 12*a* are deflected. The constant distance between adjacent contacts 22 improves the uniformity of the impedance between the different signal channels. Importantly, the web 13 does not mechanically interfere with mating of the contacts 12 to the edge card.

The dielectric properties of the wafer 11 and the webs 13 can be chosen to optimize signal integrity of signals transmitted through the connector.

Referring to FIGS. 8 and 9, the contacts 12 can be divided into different zones in which the arrangement of the spacing between the contacts 12 changes because of signal integrity considerations and/or mechanical considerations. In the first zone for the contact tips 12*b*, the spacing between adjacent contacts 12 can match the spacing on the pads on the edgecard. Because the tips 12*b* of the contacts 12 are stubs, impedance matching is no longer required in this zone. In fact, increasing the impedance in the first zone is desirable to minimize its influence on transmission in the edgecard.

Mated contact between the contact beams 12*a* and the edgecard occurs at approximately the boundary between the first zone and the second zone. In the second zone for the movable contact beams 12*a*, the spacing between the contacts 22 of a differential pair can be adjusted because the web 13, with a higher dielectric constant, is located between the contacts 22. In the second zone, it is also possible to decrease the spacing between the contacts of a differential pair to increase the coupling between the contacts 22 of the differential pair and to increase the spacing between adjacent differential pairs to reduce cross-talk between adjacent differential pairs.

The third zone refers to the embedded portion of the contacts 12, where the contacts 12 do not move during mating. The spacing between the contacts 22 of a differential pair can be further increased in this zone because this portion of the contacts 22 is embedded in the wafer 11 so that it cannot move. It is also possible to adjust the impedance by removing portions of the wafer 11. For example, in FIG. 9, portions of the wafer 11 adjacent to the ground contacts 23 can be removed to reduce the coupling between the adjacent differential pairs 22 and the ground contact 23.

In the fourth zone, the contact beams 12a are fixed, so the spacing between the contacts 22 in a differential pair can be reduced since no tolerance for mechanical motion during mating is required. Impedance matching can be controlled by increasing the width of the differential pair contacts 22. In the fourth zone, it is possible to use air as the dielectric because the freedom in contact beam 12a geometry allows impedance matching without use of a dielectric material.

In the fifth zone of the contact tail 12c, the widths of the contacts 12 are reduced to ensure enough spacing so that the contact tail 12c can be soldered to the PCB without shorting together adjacent contacts 12.

Figure 14:
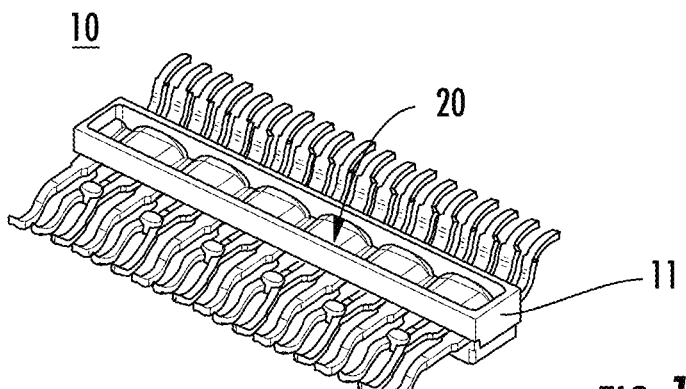
FIG. 14 is a perspective view of a lead frame according to a preferred embodiment of the present invention.
Figure 15:
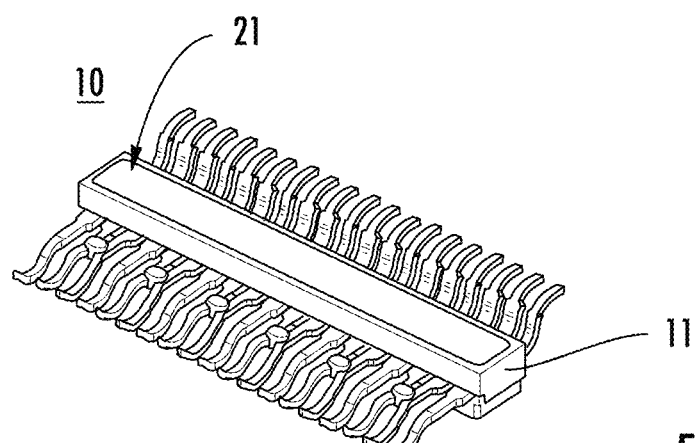
FIG. 15 is a perspective view of the lead frame shown in FIG. 14 filled with conductive epoxy.
Figure 16:
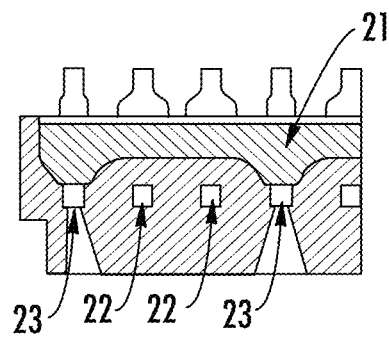
FIG. 16 is a sectional view of the lead frame shown in FIG. 15.

FIG. 14 shows a bottom view of a lead frame 10. The wafer 11 of the lead frame 10 includes a cavity 20 that extends along the length of the wafer 11. The cavity 20 can be filled with a conductive epoxy or a similar hardening conductive material to cast a ground shield 21 as shown in FIGS. 15 and 16. The ground shield 21 can partially surround the adjacent contacts 22. The ground shield 21 can make electrical contact with the ground contacts 23. The conductive epoxy can be used to shift the resonance frequency of the connector. For example, the conductive epoxy, such as a lossy or magnetic absorbing material, can shift the resonance frequency to above 28 GHz, allowing the connector to have excellent signal integrity at this bandwidth.

Figure 17:
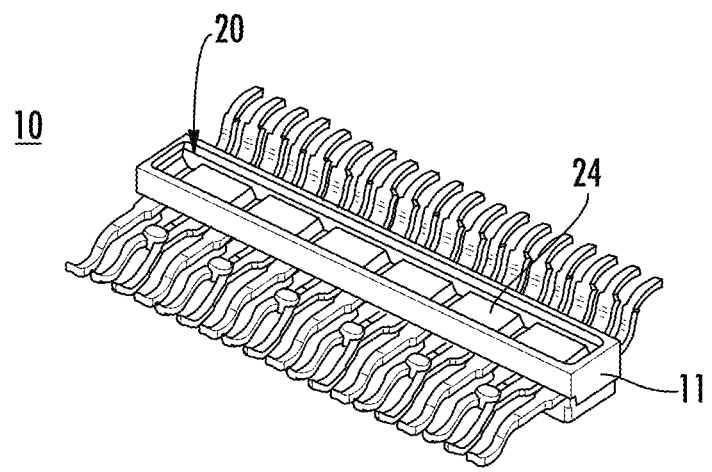
FIG. 17 is a perspective view of the lead frame shown in FIG. 14 filled with a thin, stamped shield.
Figure 18:
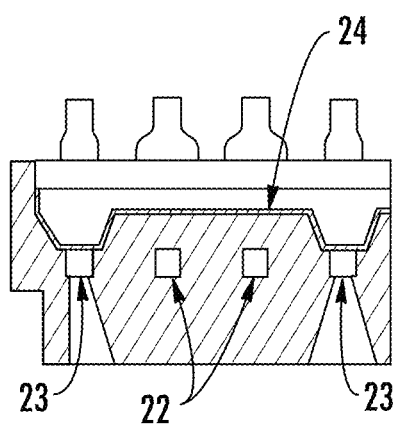
FIG. 18 is a sectional view of the lead frame shown in FIG. 17.
Figure 19:
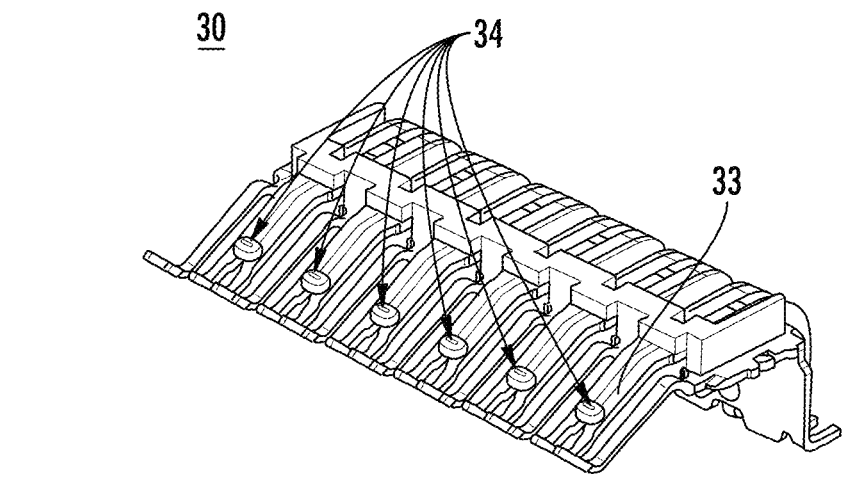
FIG. 19 is a front perspective view of a lead frame for a top row of contacts according to a preferred embodiment of the present invention.
Figure 20:
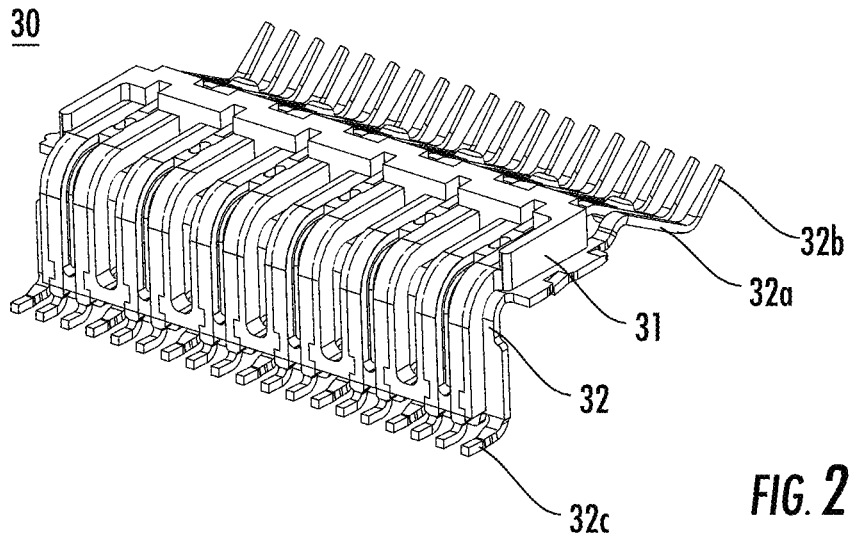
FIG. 20 is a back perspective view of the lead frame shown in FIG. 19.
Figure 21:
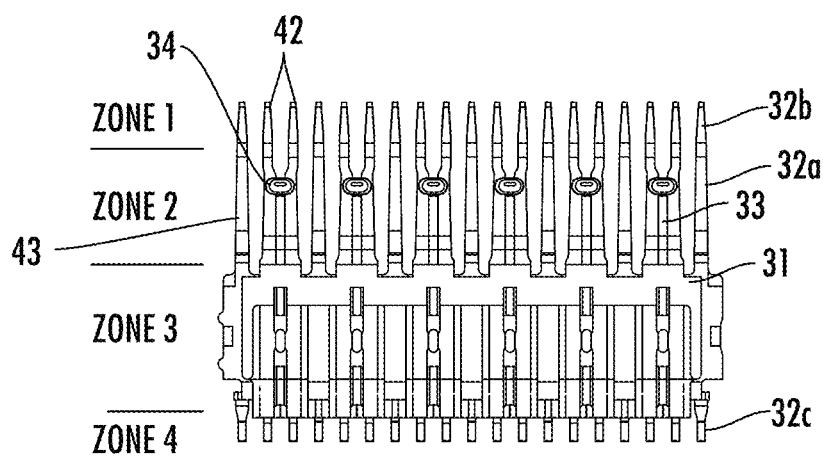
FIG. 21 is a top view of the lead frame shown in FIG. 19.

Instead of a conductive epoxy, a formed metallic or lossy metal, conductive shield 24 can be used as shown in FIGS. 17 and 18. The formed metallic or lossy shield 24 is preferably a thin, stamped metal or carbon based polymer, but other suitable materials could also be used to form the formed metallic or lossy shield 24. As shown in FIG. 18, the formed metallic or lossy shield 24 can partially surround the adjacent pairs 22, and the formed metallic or lossy shield 24 can make contact with the ground contacts 23.

FIGS. 19-23 show a lead frame 30 that can be used as the top row of contacts 32. Reference number 32 generally refers to all of the contacts, which include ground contacts 43 and contacts 42 in a differential pair. As with the bottom row of contacts 12, the lead frame 30 for the top row of contacts 32 can include webs 33 and buttons 34. Also the contacts 32 can be divided into zones. In the first zone for the contact tips 32b, the spacing between adjacent contacts 32 can be adjusted to match the spacing on the pads on the edgecard. Because the tips 32b of the contacts 32 are stubs, impedance matching is no longer required in this zone. In fact, increasing the impedance in the first zone is desirable to minimize its influence on transmission in the edgecard.

When mated, contact between the contact beams 32a and edgecard occurs at approximately the boundary between the first zone and the second zone. In the second zone for the movable contact beams 32a, the spacing between the contacts 42 of a differential pair can be adjusted because the web 33, with a higher dielectric constant, is located between the contacts 42 of the differential pair. In the second zone, it is also possible to decrease the spacing between the contacts 42 of a differential pair to increase the coupling between the contacts 42 of the differential pair and to increase the spacing between adjacent differential pairs to reduce crosstalk between adjacent differential pairs.

The third zone refers to the embedded portion of the contacts 32, where the contacts 32 do not move during mating. The spacing between the contacts 42 of a differential pair can be further increased in this zone because this portion of the contacts 42 is embedded in the wafer 31 so that it cannot move. It is also possible to adjust the impedance by removing portions of the wafer 31. For example, in FIG. 23, portions of the wafer 31 adjacent to the ground contacts 43 can be removed to reduce the coupling between the adjacent differential pairs 42 and the ground contact 43. Portions of the wafer 31 may also be removed between the differential signal pair 42 to improve performance.

In the fourth zone of the contact tail 32c, the width of the contacts 32 is reduced to ensure enough spacing so that the contact tail 32c can be soldered to the PCB without shorting together adjacent contacts.

Figure 22:
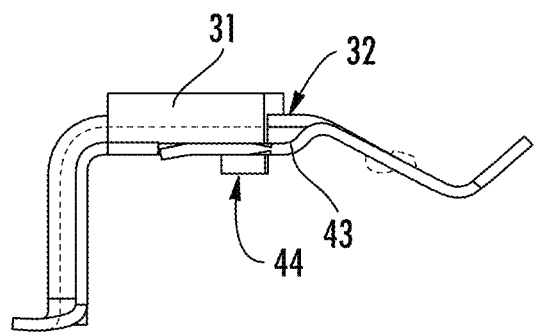
FIG. 22 is a side view of the lead frame shown in FIG. 19.

As shown in FIG. 22, the wafer 31 includes a shield 44 located underneath the contacts 32. The shield 44 can be connected to the ground contacts 43. In this arrangement, the ground contacts 43 and the contacts 42 of a differential pair can be separated by a combination of air and portions of the wafer 31.

Figure 23:
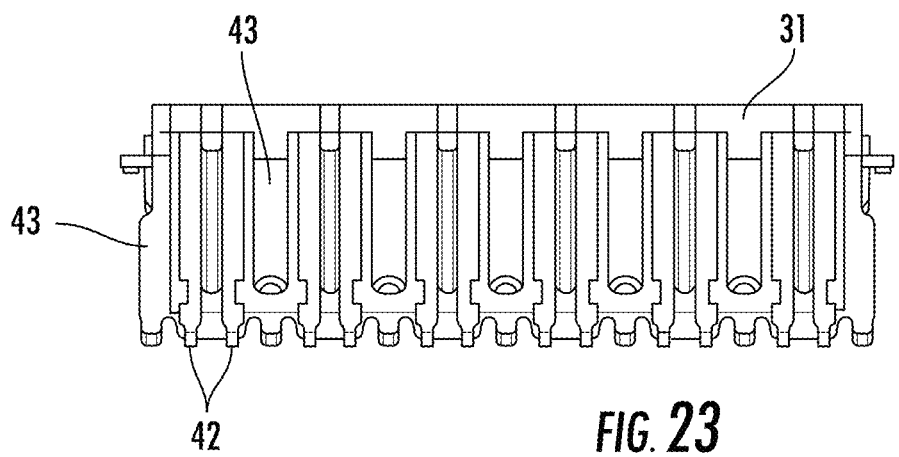
FIG. 23 is a back view of the lead frame shown in FIG. 19.

FIG. 23 shows an approach that is reversed with respect to the first and second mating ends of the first and second adjacent signal conductors. In non-mating portions of the first and second adjacent signal conductors, a web of dielectric material is removed or not added between the first and second adjacent signal conductors. Additionally, a web of dielectric material is also removed or not added between adjacent differential signal pairs. In this case, an air dielectric can improve impedance and crosstalk of the electrical connector, independent from the dielectric web positioned between the first and second adjacent signal conductors, adjacent to the first and second mating ends of the first and second adjacent signal conductors.

Figure 24:
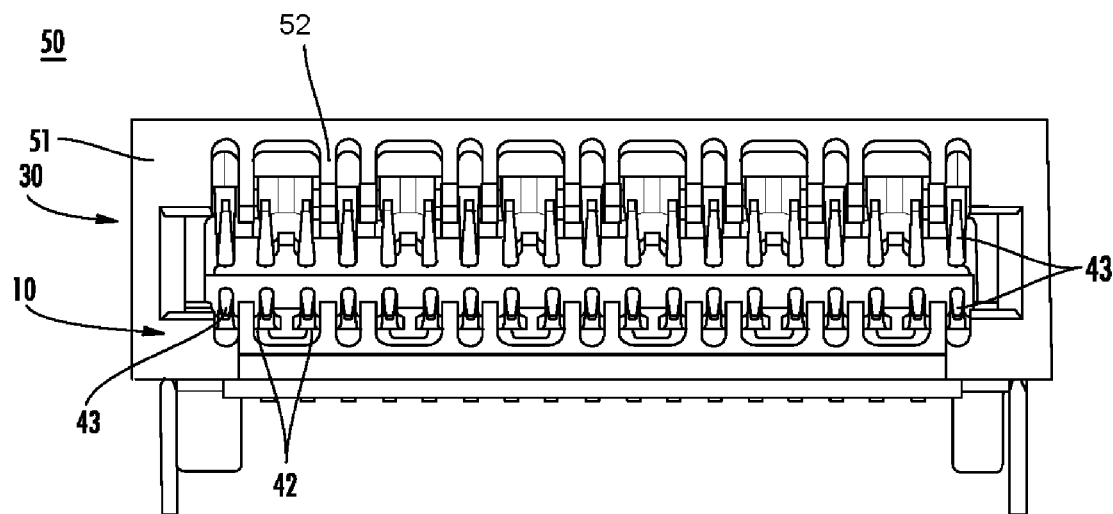
FIG. 24 is a front view of a connector according to a preferred embodiment of the present invention.
Figure 25:
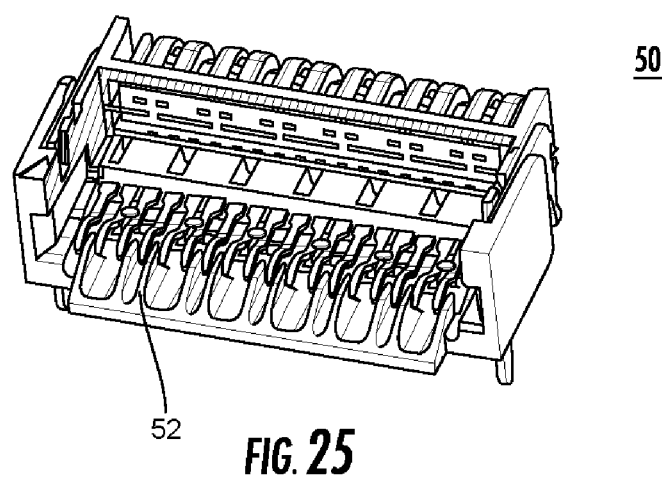
FIG. 25 is a cut-out view of the connector shown in FIG. 24.

FIGS. 24 and 25 show a connector 50 that can be used with the lead frames 10, 30 discussed above. The connector 50 includes ribs 52 between each of the ground contacts 43 and the adjacent pair of differential contacts 42 and does not include walls between the contacts 42 in each differential pair. The electrical connector housing 51 does not define front ribs between the first and second adjacent signal conductors or between the first and second mating ends of the first and second adjacent signal conductors. The first and second adjacent signal conductors will not short circuit electrically in the absence of the electrical connector housing front ribs because the first and second adjacent signal conductors are separated by the intra-conductor web discussed above. The size of the ribs 52 can be reduced such that the ribs 52 are only located near the contact tips 32b. Portions of the ribs 52 could also be removed, such as, for example, only leaving the rib 52 present near the contact tips 32b. Another arrangement to raise the impedance of the contact tips 32b is to include one rib 52 between the contacts 42 of the differential pair and to not include ribs 52 between each of the ground contacts 43 and the adjacent contacts 42 of a differential pair. This configuration is the opposite of the arrangement shown in FIGS. 24 and 25. This opposite arrangement is substantially electrically equivalent to the arrangement shown in FIGS. 24 and 25, but the arrangement in FIGS. 24 and 25 provides more ribs 52 for mechanical mating. The elimination of ribs 52 improves impedance continuity independently from the air pockets defined adjacent to the non-mating portions of the first and second adjacent signal conductors, independently from the air pockets defined between adjacent differential contact pairs, independently of the web defined between the first and second adjacent signal conductors, or in combination with any one or more of these descriptions.

The connector 50 achieves a differential insertion loss of less than −1 dB at frequencies between approximately 1 GHz and approximately 25 GHz. The connector 50 achieves a differential insertion loss of less than −1 dB at frequencies between approximately 1 GHz and approximately 33 GHz. A frequency domain near end crosstalk of the connector 50 is below −50 dB at frequencies between approximately 1 GHz and approximately 34 GHz. A frequency domain near end crosstalk of the connector 50 is below −60 dB at frequencies between approximately 1 GHz and approximately 31 GHz. A frequency domain far end crosstalk of the connector 50 is below −50 dB at frequencies between approximately 1 GHz and approximately 34 GHz. A frequency domain far end crosstalk of the connector 50 is below −60 dB at frequencies between approximately 1 GHz and approximately 25 GHz.

Figure 26:
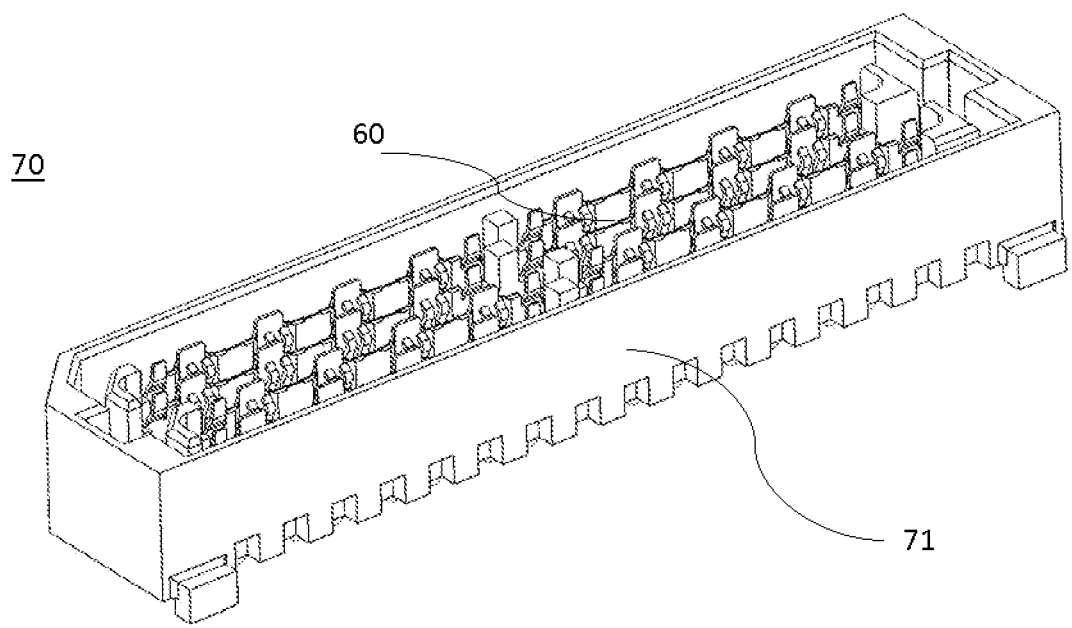
FIG. 26 is a perspective view of a connector according to a preferred embodiment of the present invention.

FIGS. 26-29 illustrate a connector of a second preferred embodiment of the present invention. As shown in FIG. 26, the male connector 70 includes a housing 71 and a lead frame 60 including a plurality of contact assemblies. As oriented in FIG. 26, the connector 70 can be mounted to a PCB with the contacts connected to traces of the PCB.

Figure 27:
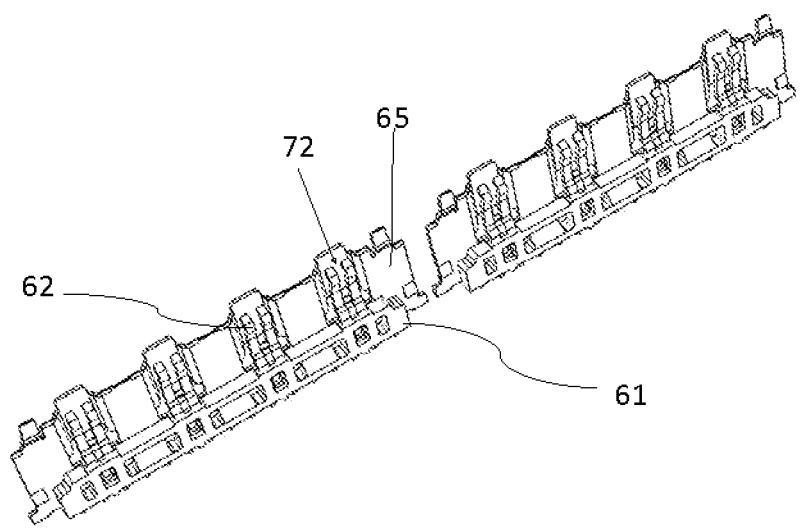
FIG. 27 is a view of a contact row of a lead frame from the connector shown in FIG. 26.

FIG. 27 illustrates one of the plurality of contact rows in the lead frame 60. As shown in FIG. 27, the contact row includes two separate contact assemblies each including a wafer 61 of a dielectric material, a plurality of contacts 62 defined as adjacent differential pairs of contacts 72, and a conductive ground shield 65. It should be understood that the lead frame 60 can include one or any number of similar assemblies. As shown in FIG. 27, the plurality of differential pairs of contacts 62 are located between the wafer 61 and the ground shield 65, but other arrangements are also possible.

Figure 28:
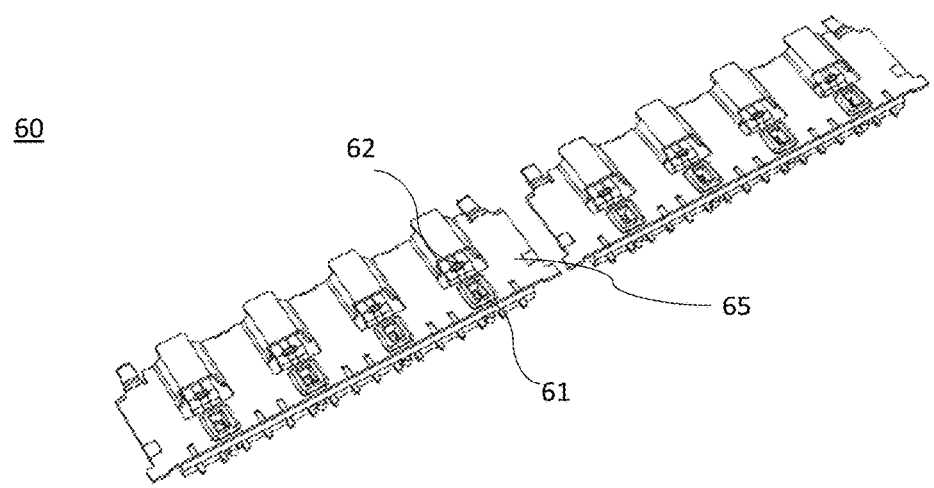
FIG. 28 is another view of the contact row of the lead frame shown in FIG. 27.

FIG. 28 illustrates another view of the contact row shown in FIG. 27. FIG. 28 shows a portion of the wafer 61 protruding through the ground shield 65 and the differential pairs of contacts 72 visible through an opening in the ground shield 65.

Figure 29:
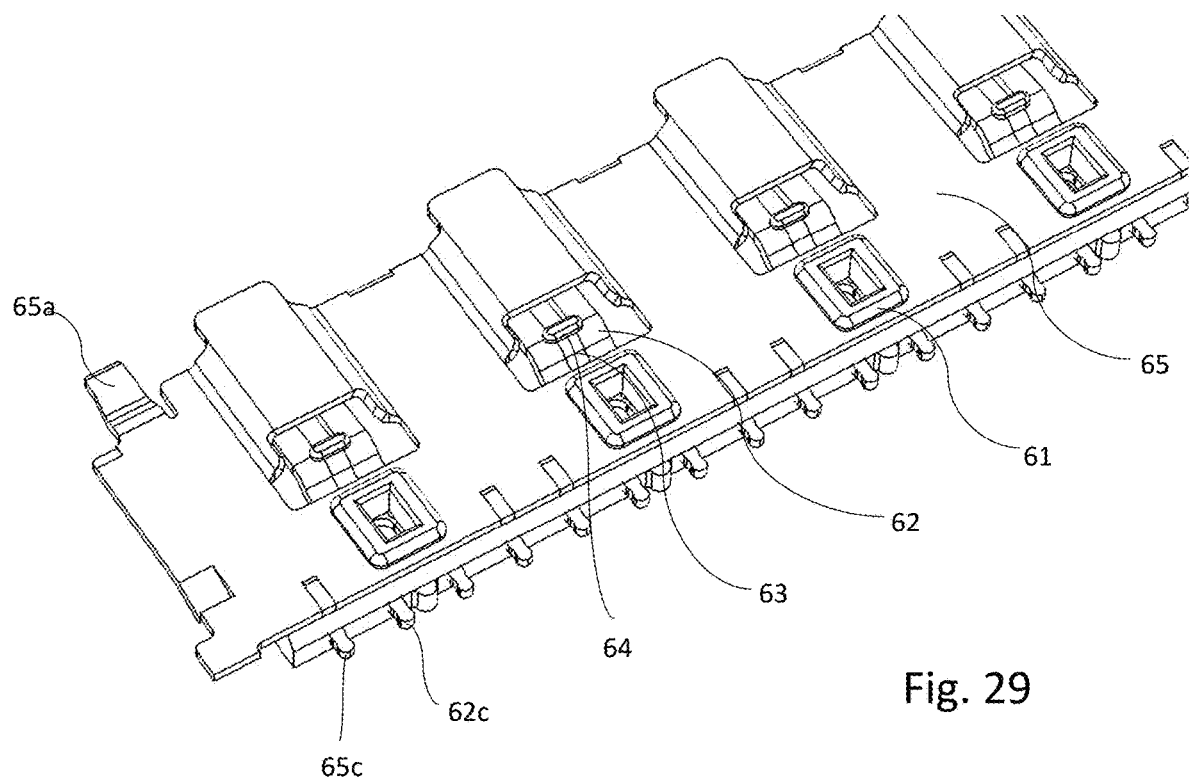
FIG. 29 is a close-up view of the contact row shown in FIG. 28.

FIG. 29 illustrates a close-up of the view of the contact row of the lead frame 60 shown in FIG. 28. As shown through the opening in the ground shield 65 in FIG. 29, there is a web 63 and a button 64 between the contacts 62 of the adjacent differential pair of contacts 72. As described above, the web 63 and the button 64 can be extensions of the wafer 61 of dielectric material and used to adjust the spacing and impedance between the contacts 72 to manage the crosstalk and coupling of signals. Also, FIG. 29 shows the tails 62c of contacts 62 and tails 65c of the ground shield 65 used to solder the connector 70 to a PCB. Tabs 65a can be included at portions of the ground shield 65 to define portions of the ground shield 65 that can be connected with contacts of the mating connector, as further discussed below.

Figure 30:
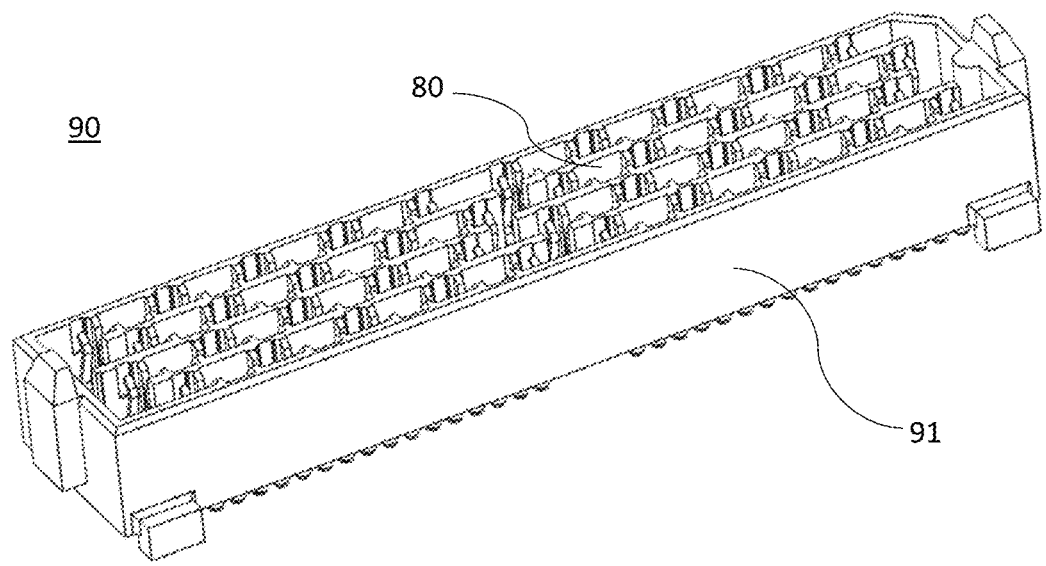
FIG. 30 is a perspective view of a mating connector according to a preferred embodiment of the present invention.

FIG. 30 illustrates a mating connector of the second preferred embodiment of the present invention. As shown in FIG. 30, the female connector 90 includes a housing 91 and a lead frame 80 including a plurality of contact assemblies. As oriented in FIG. 30, the connector 90 can be mounted to an electrical component such as a PCB, traces, cables, etc. When aligned, the female connector 90 of FIG. 30 can mate with the male connector 70 of FIG. 26 and connect two PCBs together. When mated, the ground contacts 93 and adjacent differential pair of contacts 92 of the female connector 90 make physical contact and an electrical connection with corresponding portions of the ground shield 65 and adjacent differential contacts 72 of the male connector 70.

Figure 31:
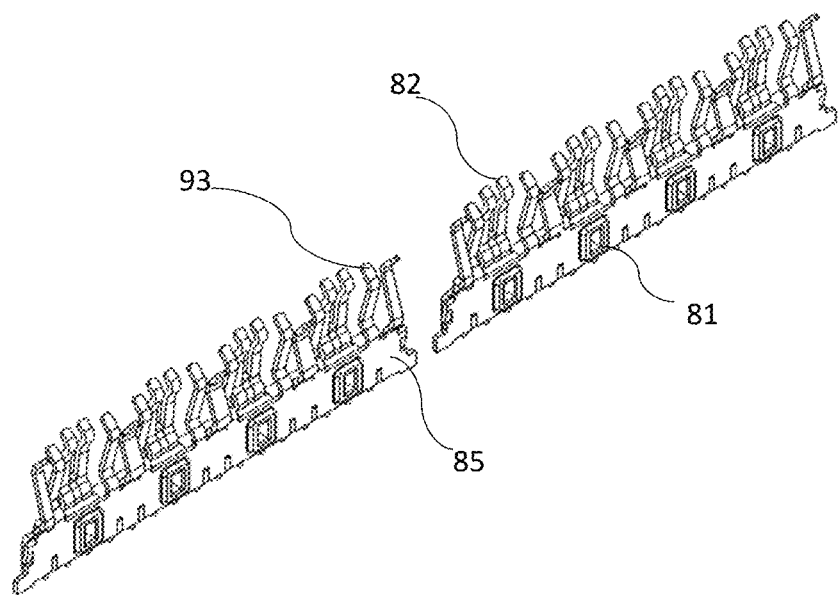
FIG. 31 is a view of a contact row of a lead frame from the connector shown in FIG. 30.

FIG. 31 illustrates one of the plurality of contact rows in the lead frame 80. As shown in FIG. 31, the contact row includes two separate contact assemblies each including a conductive ground shield 85 with contacts 93, a wafer 81 of a dielectric material shown protruding through the ground shield 85, and a plurality of contacts 82. It should be understood that the lead frame 80 can include one or any number of similar assemblies.

Figure 32:
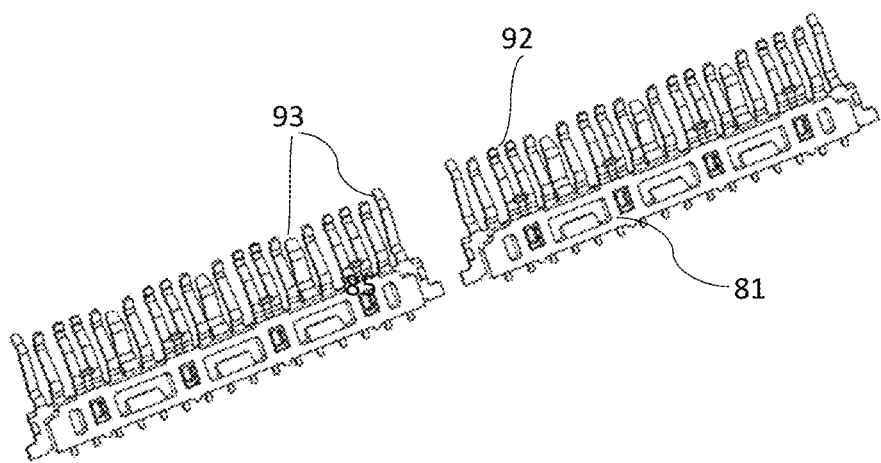
FIG. 32 is another view of the contact row of the lead frame shown in FIG. 30.

FIG. 32 illustrates another view of the contact row shown in FIG. 31. As shown in FIG. 32, adjacent contacts 82 define a plurality of differential pairs of contacts 92. The differential pairs of contacts 92 are alternately located between sets of ground contacts 93 along the row of contacts.

Figure 33:
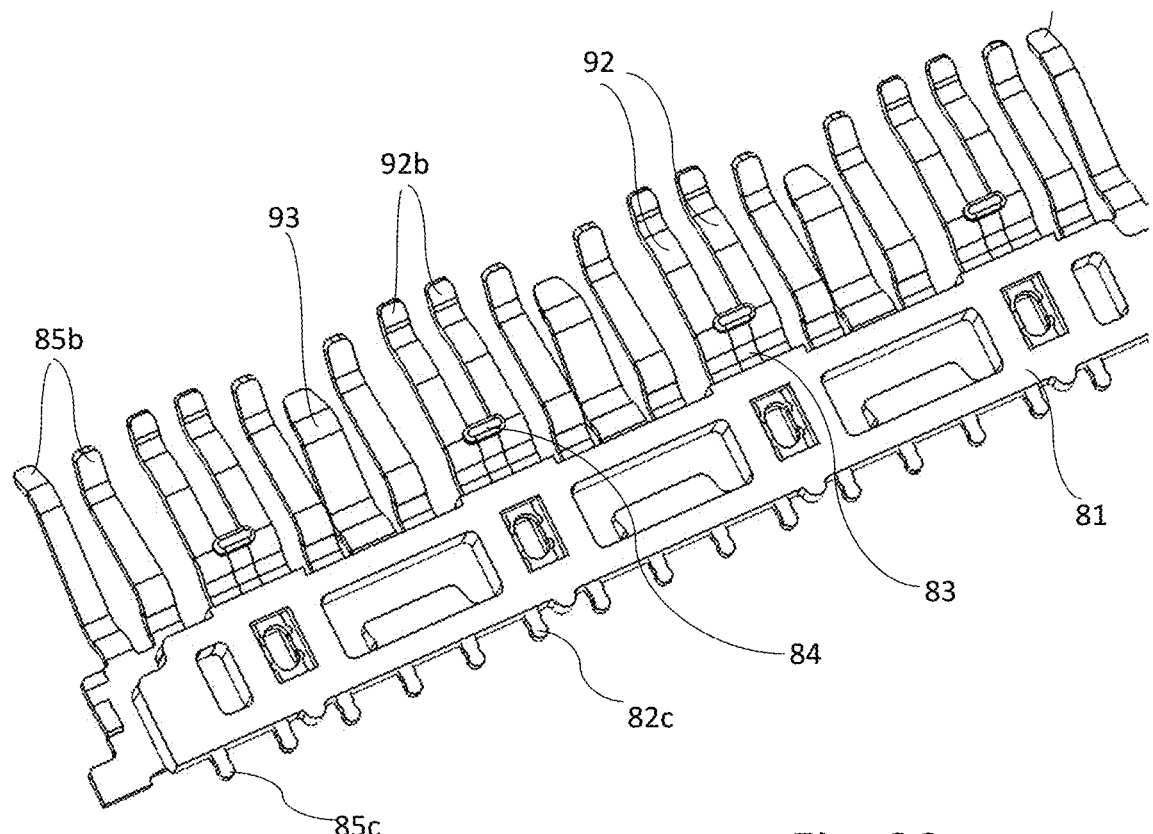
FIG. 33 is a close-up view of the contact row shown in FIG. 32.

FIG. 33 illustrates a close-up of the view of the contact row of the lead frame 80 shown in FIG. 32. As shown, there is a web 83 and a button 84 between the contacts 82 of the adjacent differential pair of contacts 92. As discussed above, the web 83 and the button 84 can be extensions of the wafer 81 and used to adjust the spacing and impedance between the contacts 92 to manage the crosstalk and coupling of signals. Also, FIG. 32 shows the tails 82c of the contacts 92 and the tails 85c of the ground shield contacts 93 used to solder the connector 90 to a PCB.

Tips 85b of alternating individual contacts 82 of the sets of ground contacts 93 are bent in opposing directions to aid in contact and connector retention when mated with the tabs 65a of the ground shield 65 of the male connector 70. Tips 82b of the contacts 92 are bent in directions opposite to the corresponding tips of the contacts 72 in the male connector 70.

Figure 34:
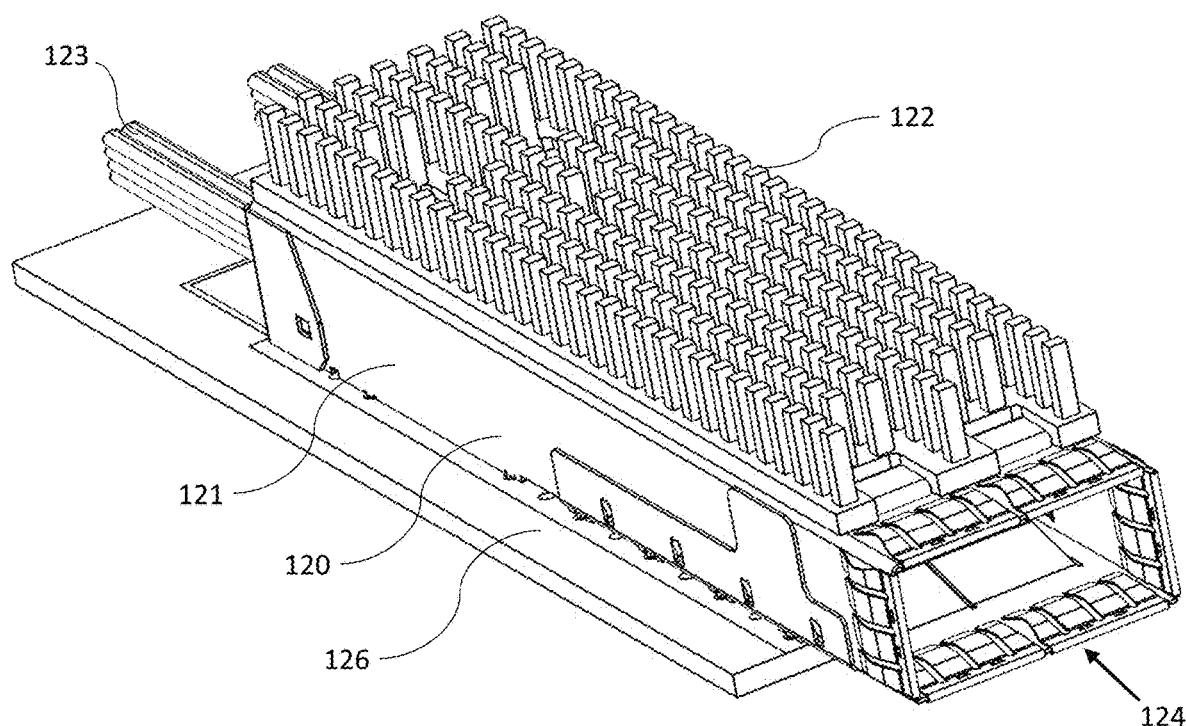
FIGS. 34 and 35 are perspective views of a cage assembly according to a preferred embodiment of the present invention.
Figure 35:
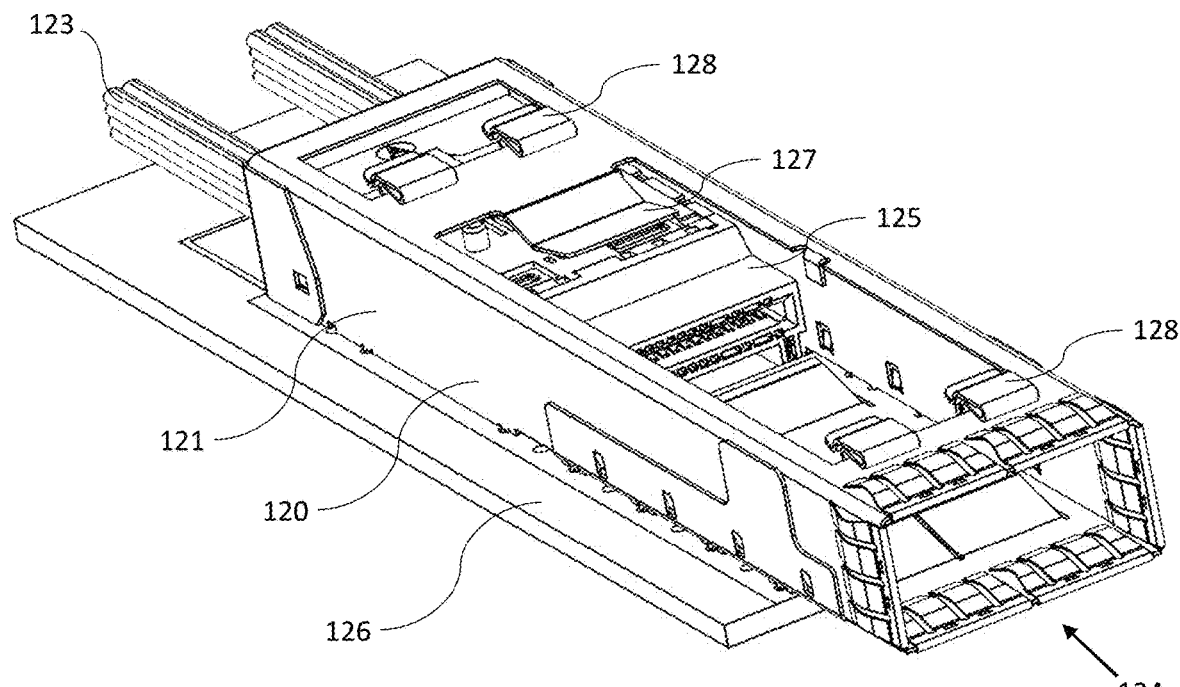

FIGS. 34 and 35 show a cage assembly 120 according to a preferred embodiment of the present invention. A transceiver (not shown) can be plugged into the opening 124 of the cage assembly 120. Any suitable transceiver can be used. The cage assembly 120 is mounted to the PCB 126 and includes a cage 121, a heatsink 122, and a cables 123. Any suitable substrate can be used instead of the PCB 126. FIG. 34 shows the cage assembly 120 with the heatsink 122, and FIG. 35 shows the cage assembly 120 without the heatsink 122. The heatsink 122 is attached to the cage 121 using a retention latch 127 and a clips 128 that allow the heatsink 122 to float with respect to the cage 121. The retention latch 127 and the clips 128 can provide a force that pushes the heatsink 122 into contact with the transceiver when the transceiver is plugged into the cage assembly 120. It is possible to attach the heatsink 122 to the cage 121 in any suitable manner. For example, the heatsink 122 can be attached to the cage 121 so that the heatsink does not float, i.e., the heatsink 122 is fixed relative to the cage 121. It is possible to use any suitable heat exchanger instead of heatsink 122, including, for example, active heat exchangers such as a cold plate or a heat pipe.

A receptacle 125 is located within the cage 121 as shown in FIG. 35. Cables 123 can extend from the back of the cage 121 and can be connected to the receptacle 125. The cables 123 can be referred to as "flyover cables" because the cables 123 make a direct electrical connection between the receptacle 125 and a remote location on the PCB 126, i.e. the cables 123 flyover the PCB 126. Any suitable cables can be used for the flyover cables 123, including, for example, twinaxial and coaxial cables. The cables 123 can include low-speed flyover cables and high-speed flyover cables.

Figure 36:
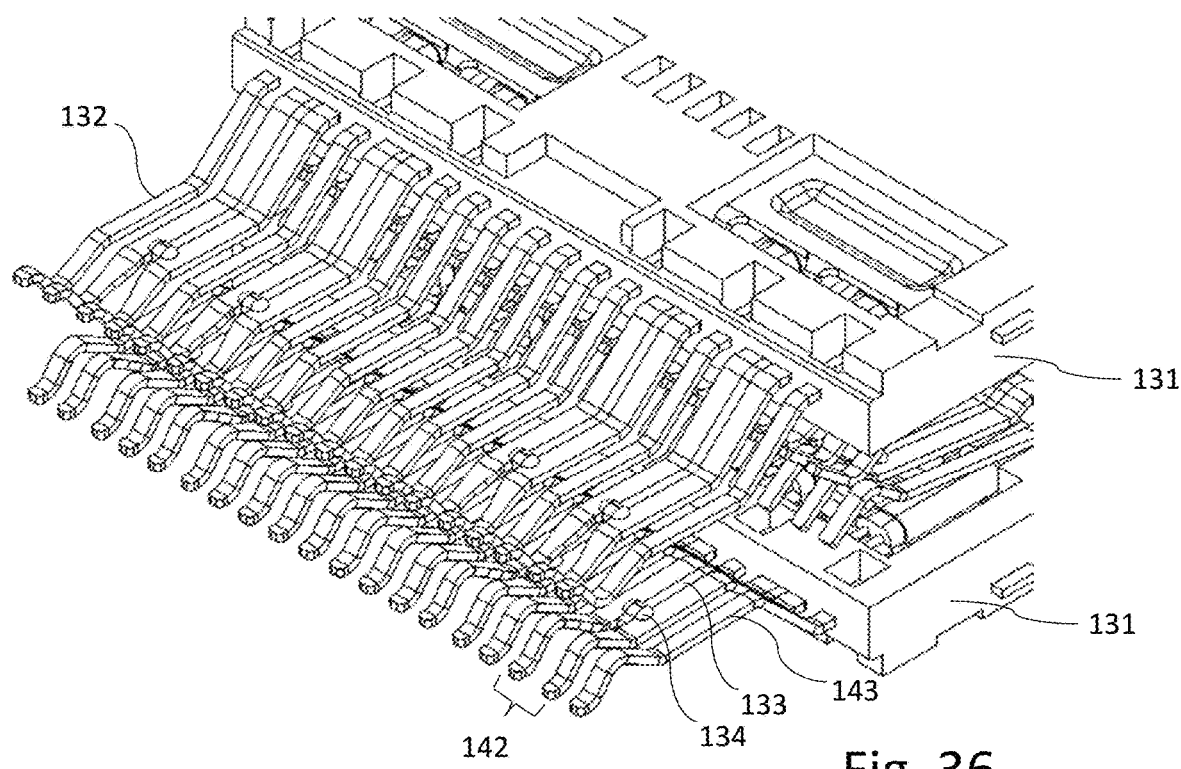
FIGS. 36 and 37 are close-up perspective views of the contacts of the receptacle in the cage assembly shown in FIG. 34.
Figure 37:
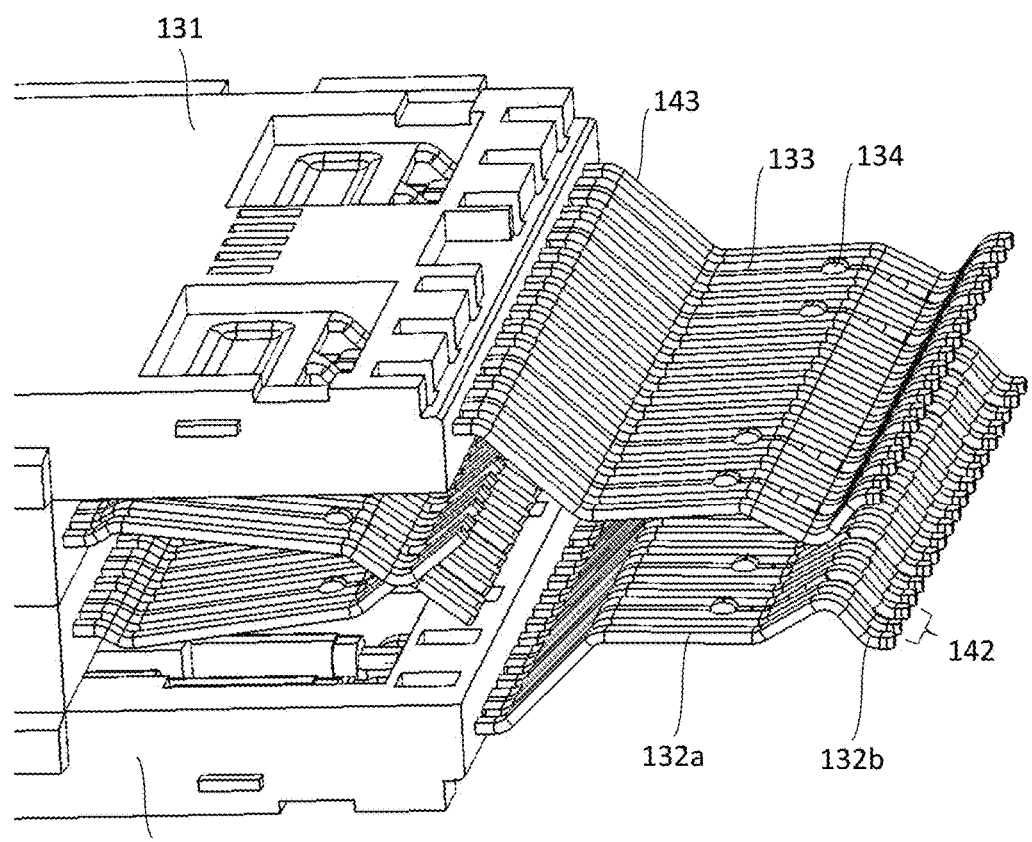

The receptacle 125 is mounted to the PCB 126 and can include an opening into which an edgecard of the transceiver can be inserted. FIGS. 36 and 37 show the contacts 132 within the receptacle 125. Each of the contacts 132 includes a beam 132a, a tip 132b, and a tail (not shown but connected to a corresponding cable 123). The edgecard includes pads that engage with the beams 132a of the contacts 132. Reference number 132 generally refers to all of the contacts, which include ground contacts 143 and contacts 142 in a differential pair. The beams 132a deflect as the edgecard is inserted into the receptacle 125, creating a mechanical and electrical connection between the contacts 132 and pads. An edgecard to be used with the receptacle 125 can include pads on the top and bottom surfaces that engage with the top row of contacts 132 and with the bottom row of contacts 132. As shown in FIG. 37, the contacts 132 can be arranged into four rows: a top-front row, a top-back row, a bottom-front row, and a bottom-back row. The pads on the edgecard can be arranged into corresponding rows. This arrangement of contacts 132 and pads can be referred to as "double density." It is possible to use other arrangements of contacts 132 and pads, including, for example, top and bottom rows of contacts and corresponding top and bottom rows of pads.

In the receptacle 125, some contacts 132 can be directly connected to the PCB 128 and other contacts 132 can be connected to the cables 123. The receptacle 125 can include press-fit tails or eye-of-the-needle tails that can be inserted into corresponding holes in the PCB 126 to mount the receptacle 125 to the PCB 126. It is possible to mount the receptacle to the intermediate PCB in other manners, including, for example, surface-mount technology (SMT) or through-hole soldering.

As shown in FIGS. 36 and 37, the contacts 132 are included in wafers 131. Each row of contacts 132 is included in its own wafer 131. A web 133 fills at least a portion of the gap between the adjacent beams 132a of the differential signal contacts 132. The web 133 can include a button 134 toward the tips 132b of the contacts 142. The button 134 anchors the web 133 to the beams 132a, allowing the web 133 to move with the beams 132a as the beams 132a deflect. The web 133 keeps the adjacent contacts 142 spaced apart at a constant distance from each other, even when the beams 132a are deflected. The constant distance between adjacent contacts 142 improves the impedance matching.

Any description of a preferred embodiment disclosed herein can apply to the other preferred embodiments disclosed herein. It should be understood that the foregoing description is only illustrative of the present invention. Various alternatives and modifications can be devised by those skilled in the art without departing from the present invention. Accordingly, the present invention is intended to embrace all such alternatives, modifications, and variances that fall within the scope of the appended claims.

What is claimed is:

1. An electrical connector comprising:
a dielectric housing; and
first, second, third, and fourth electrical contacts that extend from the dielectric housing; wherein
the dielectric housing includes:
    a first web that extends from the dielectric housing independent from and between the first and the second electrical contacts to fill at least a portion of a gap between the first and the second electrical contacts; and
    a second web that extends from the dielectric housing independent from and between the third and the fourth electrical contacts to fill at least a portion of a gap between the third and the fourth electrical contacts; and
a web is not located between the second electrical contact and the third electrical contact.

2. The electrical connector of claim 1, wherein the first and the second webs are integral with the dielectric housing.

3. The electrical connector of claim 1, wherein, when a mating connector applies a force to mating surfaces of the first and the second electrical contacts, the first and the second electrical contacts and the first and the second webs all move in a first direction.

4. The electrical connector of claim 1, wherein each of the first and the second webs are cantilevered with respect to a pivot point adjacent to the dielectric housing.

5. The electrical connector of claim 1, wherein:
the first and the second electrical contacts are positioned edge-to-edge;
the third and the fourth electrical contacts are positioned edge-to-edge;
the first web physically connects the first and the second electrical contacts; and
the second web physically connects the third and the fourth electrical contacts.

6. The electrical connector of claim 1, further comprising:
a first dielectric button positioned only between the first and the second electrical contacts; and
a second dielectric button positioned only between the third and the fourth electrical contacts.

7. The electrical connector of claim 1, further comprising a fifth electrical contact positioned immediately adjacent to the second electrical contact and to the third electrical contact; wherein
the electrical connector is devoid of dielectric material other than air between the second and the fifth electrical contacts where the second and the fifth electrical contacts extend from the dielectric housing; and
the electrical connector is devoid of dielectric material other than air between the third and the fifth electrical contacts where the third and the fifth electrical contacts extend from the dielectric housing.

8. The electrical connector of claim 1, further comprising a dielectric wafer housing that is located within the dielectric housing; wherein
the first, the second, the third, and the fourth electrical contacts and the first and the second webs are each cantilevered with respect to the dielectric wafer housing.

9. The electrical connector of claim 1, wherein
the first web does not surround an entire perimeter of either the first electrical contact or the second electrical contact; and
the second web does not surround an entire perimeter of either the third electrical contact or the fourth electrical contact.

10. The electrical connector of claim 1, wherein
the first and the second electrical contacts are positioned adjacent to each other to define a first differential signal pair; and
the third and the fourth electrical contacts are positioned adjacent to each other to define a second differential signal pair.

11. The electrical connector of claim 1, wherein
the first web only extends between the first and the second electrical contacts; and
the second web only extends between the third and the fourth electrical contacts.

12. The electrical connector of claim 1, further comprising a ground shield.

13. The electrical connector of claim 12, wherein the ground shield surrounds three sides of the first and the second electrical contacts.

14. The electrical connector of claim 1, wherein the first, the second, the third, and the fourth electrical contacts define respective first, second, third, and fourth mating surfaces.

15. The electrical connector of claim 14, wherein
inner facing surfaces of the first and the second electrical contacts are adjacent to the first and the second mating surfaces; and inner facing surfaces of the third and the fourth electrical contacts are adjacent to the third and the fourth mating surfaces.

\* \* \* \* \*